US012578385B2

(12) United States Patent
Floridia et al.

(10) Patent No.: US 12,578,385 B2
(45) Date of Patent: Mar. 17, 2026

(54) SCAN-TESTABLE ELECTRONIC CIRCUIT AND CORRESPONDING METHOD OF TESTING AN ELECTRONIC CIRCUIT

(71) Applicant: STMicroelectronics International N.V., Geneva (CH)

(72) Inventors: Andrea Floridia, Catania (IT); Michelangelo Massimo Maria Grosso, Turin (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/742,474

(22) Filed: Jun. 13, 2024

(65) Prior Publication Data

US 2024/0426908 A1 Dec. 26, 2024

(30) Foreign Application Priority Data

Jun. 21, 2023 (IT) ........................ 102023000012801

(51) Int. Cl.
*G01R 31/3185* (2006.01)
(52) U.S. Cl.
CPC ................ *G01R 31/318541* (2013.01); *G01R 31/318536* (2013.01); *G01R 31/318552* (2013.01); *G01R 31/318555* (2013.01); *G01R 31/318572* (2013.01)
(58) Field of Classification Search
CPC .... G01R 31/318541; G01R 31/318536; G01R 31/318552; G01R 31/318555; G01R 31/318572
See application file for complete search history.

(56) References Cited

U.S. PATENT DOCUMENTS

| | | | |
|---|---|---|---|
| 10,955,473 B1 * | 3/2021 | Jain | G01R 31/3177 |
| 11,604,223 B1 * | 3/2023 | Mangal | G01R 31/318536 |
| 2001/0037479 A1 | 11/2001 | Whetsel | |
| 2002/0162065 A1 * | 10/2002 | Kashiwagi | G01R 31/318552 |
| | | | 714/726 |
| 2011/0258498 A1 | 10/2011 | Chandra et al. | |
| 2013/0305106 A1 * | 11/2013 | Mittal | G01R 31/318536 |
| | | | 714/E11.155 |
| 2018/0045778 A1 | 2/2018 | Narayanan et al. | |

* cited by examiner

*Primary Examiner* — Cynthia Britt

(74) *Attorney, Agent, or Firm* — Slater Matsil, LLP

(57) ABSTRACT

A scan-testable integrated circuit includes a logic circuit configured to receive test mode control signals, a signal interface configured to receive scan-in, scan enable and scan clock signals, and produce a scan-out signal, and a scan register including a plurality of scan cells coupled to the signal interface to receive the scan enable and scan clock signals. Additional scan cells are coupled to the signal interface, and configured to receive and propagate the scan-in signal when the scan enable signal is asserted. Data retention cells are coupled to respective ones of the additional scan cells and to the logic circuit, and configured to provide as output the values stored in the respective additional scan cells to produce the test mode control signals when the scan enable signal is de-asserted, and configured to prevent the test mode control signals from changing value when the scan enable signal is asserted.

20 Claims, 4 Drawing Sheets

SCAN-TESTABLE ELECTRONIC CIRCUIT AND CORRESPONDING METHOD OF TESTING AN ELECTRONIC CIRCUIT

CROSS REFERENCE TO RELATED APPLICATION(S)

This application is a translation of and claims the priority benefit of Italian patent application number 102023000012801, filed on Jun. 21, 2023, entitled "Scan-testable electronic circuit and corresponding method of testing an electronic circuit," which application is hereby incorporated by reference herein to the maximum extent allowable by law.

TECHNICAL FIELD

The description relates to circuits and methods for testing digital integrated circuits (ICs) and mixed-signal integrated circuits or, more generally, any electronic circuit including digital logic.

In particular, the description relates to scan-based test techniques for digital logic circuits.

BACKGROUND

Digital logic circuits are conventionally tested by means of the scan methodology. In a scan-based test, at least some of the sequential elements of the logic circuit (e.g., the flip-flops, which are implemented as scan flip-flops) can be (temporarily) reconfigured as shift registers, enabling direct read/write access to at least some of the internal nodes of the logic circuit via the I/O pins of the integrated circuit, thus simplifying the generation of test patterns. The scan test procedures are often applied with different test configurations (e.g., selectively activating certain clock domains of the circuit, and/or bypassing certain functional modules such as PLLs, memories or analog blocks), which usually can be dynamically set via functional or dedicated interfaces (e.g., a JTAG interface according to standard IEEE 1149.1). In addition, it may be useful to read data from one or more functional devices of the integrated circuit during the scan operation.

The number of I/O pins of an integrated circuit is often limited, therefore specific approaches are to be devised for scan testing, such as reducing the number of scan chains (which however results in increased test time) for guaranteeing dedicated JTAG access, and/or multiplexing functionalities on the available I/O pins and defining suitable techniques for switching between scan and other protocols. In addition, the known methodologies rely on the use of different protocols for scan testing and for chip configuration, which results in an additional effort when defining the test stimuli in the product engineering environment (Automated Test Equipment, ATE). Further, the logic in the dedicated test interface cannot be generally tested by means of normal scan modes.

A known approach to scan testing thus relies on the use of a dedicated test control interface (e.g., an IEEE 1149.14-wire JTAG port) for configuring the test control registers. However, some electronic devices may not include such a dedicated test control interface (e.g., in order to reduce their cost).

Other known approaches to scan testing may include:
interleaving functional and scan configuration of I/O pins and logic, which may require a full reset or power cycling of the integrated chip to alternate between the functional mode and the scan test mode; and/or
using a functional interface (e.g., I2C) that is active during scan modes (i.e., logic not in scan).

However, such known approaches may be affected by one or more of the following drawbacks:
they may be complex to design, to implement and to apply in the manufacturing test environment;
the scan test coverage may be affected by the interface management; and
they may increase the test time (e.g., because they imply a low scan parallelism, or because they implement complex/slow protocols, or because they require the device to be turned off and on again to reset the scan mode).

Therefore, there is a need in the art to provide improved scan-based test techniques that may simplify and/or standardize the test configuration interface (e.g., resorting to less I/O pins, without multiplexing and/or without implementing a protocol decoding logic), as well as simplify the test procedure development, without relying on a dedicated (e.g., JTAG) test interface.

SUMMARY

An object of one or more embodiments is to contribute in providing such improved scan-based test techniques (e.g., a scan-based data I/O interface and a related test mode configuration methodology) that may result in a reduction of the number of test protocols employed for testing, a reduction in design complexity (e.g., via automatization) and/or a reduction of the test flow setup time.

According to one or more embodiments, such an object can be achieved by a scan-testable circuit having the features set forth in the claims that follow.

One or more embodiments may relate to a corresponding method of testing an electronic circuit.

The claims are an integral part of the technical teaching provided herein in respect of the embodiments.

According to an aspect of the present description, a scan-testable integrated circuit includes a logic circuit configured to receive one or more test mode control signals. The integrated circuit includes a signal interface configured to receive a scan-in signal, a scan enable signal and a scan clock signal, and configured to produce a scan-out signal. The integrated circuit includes a scan register including a plurality of scan cells coupled to the signal interface to receive the scan enable signal and the scan clock signal. The scan cells are selectively couplable to the logic circuit in response to the scan enable signal being de-asserted, or serially one to another so as to form a scan chain arranged to receive the scan-in signal and produce the scan-out signal in response to the scan enable signal being asserted. The integrated circuit includes one or more additional scan cells coupled to the signal interface serially one to another and configured to receive and propagate the scan-in signal in response to the scan enable signal being asserted. The integrated circuit includes one or more data retention cells coupled to respective ones of the one or more additional scan cells and to the logic circuit. The one or more data retention cells are configured to provide as output the one or more values stored in the respective additional scan cells to produce the one or more test mode control signals in response to the scan enable signal being de-asserted, and are configured to prevent the one or more test mode control signals from changing value in response to the scan enable signal being asserted.

One or more embodiments may thus provide a scan-testable electronic circuit in which the test can be configured without using a dedicated test configuration interface (e.g., JTAG) or a functional I/O interface, and without using a dedicated configuration protocol.

According to another aspect of the present description, a method of testing an electronic circuit according to embodiments includes:

providing a scan-in signal, a scan enable signal and a scan clock signal to the signal interface;

receiving, at the plurality of scan cells, the scan enable signal and the scan clock signal;

sequentially carrying out the following steps:

i) asserting the scan enable signal, thereby selectively coupling the scan cells serially one to another so as to form a scan chain arranged to receive the scan-in signal and configuring the one or more additional scan cells to receive and propagate the scan-in signal and configuring the one or more data retention cells to prevent the one or more test mode control signals from changing value;

ii) shifting-in a test sequence via the scan-in signal, thereby loading the scan cells and the one or more additional scan cells with a test vector and a test configuration vector, respectively;

iii) de-asserting the scan enable signal, thereby selectively coupling the scan cells to the logic circuit and producing the one or more test mode control signals for the logic circuit by outputting from the one or more data retention cells the one or more values stored in the respective additional scan cells;

iv) producing one or more clock pulses in the scan clock signal to carry out a test capture step;

v) asserting the scan enable signal; and vi) shifting-out an output sequence from the scan cells via the scan-out signal.

BRIEF DESCRIPTION OF THE DRAWINGS

One or more embodiments will now be described, by way of example, with reference to the annexed figures, wherein.

DETAILED DESCRIPTION OF EXEMPLARY EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
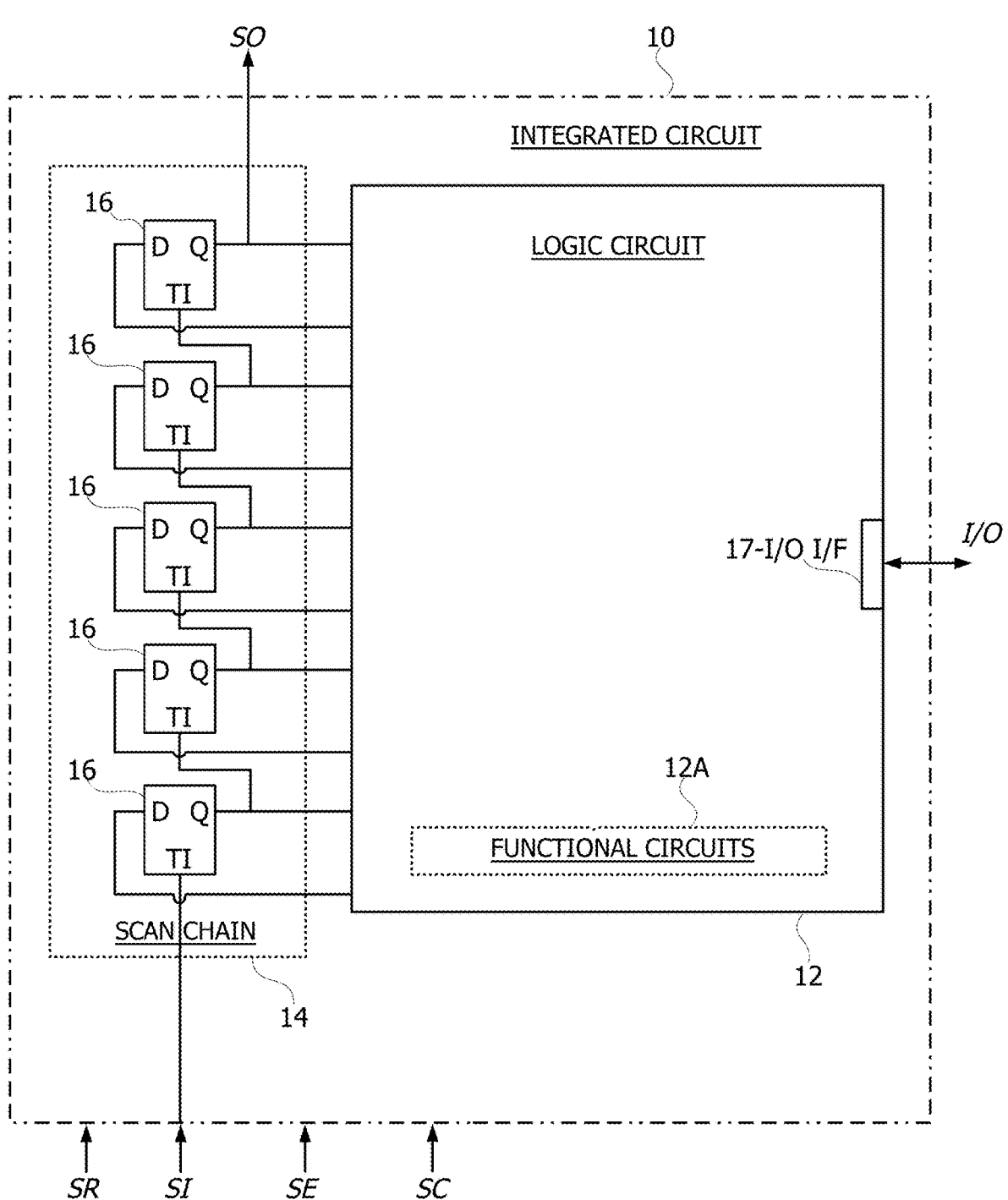
FIG. 1 is a circuit diagram exemplary of an electronic device including digital logic and a scan chain configured for scan testing.

By way of introduction to the detailed description of exemplary embodiments, reference may first be made to FIG. 1, which is a circuit diagram exemplary of an integrated circuit 10 including a conventional scan test architecture (e.g., a multiplexed scan architecture) or scan circuit. In particular, the integrated circuit 10 includes a logic circuit 12 and an associated sequential logic. The logic circuit 12 may include combinational logic (e.g., one or more combinational logic blocks), as well as one or more functional circuits 12A (e.g., phase-locked loops or PLL, memories, analog blocks, and the like). The sequential logic may be configured in a full scan architecture (e.g., if all the sequential cells are connectable in a scan chain to provide full controllability and full observability) or a partial scan architecture (e.g., if at least some of the sequential cells are not connectable in a scan chain), possibly with multiple scan chains and/or multiple scan modes. By way of example, a single scan chain 14 is illustrated in the Figures annexed herein. As known in the art, a scan chain 14 includes a plurality of scan cells 16 (also collectively referred to as a scan register). The scan cells 16 may be of different types depending on the scan architecture, e.g., including muxed-D scan cells or clocked-scan cells, and may be also referred to as scan flip-flops. Each scan cell 16 has a data input terminal D and a data output terminal Q connected to the logic circuit 12, as well as a test data input terminal TI, and optionally a test data output terminal (not shown in the Figures for ease of illustration) internally coupled to the data output terminal Q. Further, depending on the type, the scan cells 16 may have additional control terminals (not shown in the Figures for ease of illustration): for instance, muxed-D scan cells may have a clock terminal CK and a scan enable terminal SE, while clocked-scan cells may have a first (data) clock terminal DCK and a second (scan) clock terminal SCK.

The integrated circuit 10 has a functional input/output interface 17 (e.g., a set of input/output pins) connected to the logic circuit 12 and configured to exchange data signals I/O. Additionally, the integrated circuit 10 may have input and/or output pins dedicated to the scan test functionality (e.g., a test interface) such as a scan-in pin configured to receive a (e.g., one-bit) scan-in signal SI (or test data input signal), a scan enable pin configured to receive a (e.g., one-bit) scan enable signal SE, a scan clock pin configured to receive a (e.g., one-bit) scan clock signal SC, a scan reset pin configured to receive a (e.g., one-bit) scan reset signal SR, and a scan-out pin configured to produce a (e.g., one-bit) scan-out signal SO (or test data output signal). Additionally or alternatively, the test signals (e.g., SI, SE, SC, SR, SO) may be exchanged by the integrated circuit 10 via the functional interface 17 upon internal reconfiguration. All the scan cells 16 of the scan chain 14 receive the test signals in a manner known per se, and the corresponding connections are not shown in the Figures for ease of illustration. For instance, all scan cells 16 receive the scan enable signal SE, the scan clock signal SC, and the scan reset signal SR at their enable, clock and reset terminals. The first scan cell of the scan chain 14 has its test data input terminal TI connected to the scan-in pin to receive the scan-in signal SI, and the subsequent scan cells of the scan chain 14 (e.g., from the second to the last) have their respective test data input terminals TI connected to the data output terminal Q (or to the test data output terminal) of a preceding scan cell in the scan chain 14. The last scan cell of the scan chain 14 has its data output terminal Q (or its test data output terminal) connected to the scan-out pin to produce the scan-out signal SO. As known in the art, the scan cells 16 of the scan register 14 provide (e.g., full) controllability of the input nodes and (e.g., full) observability of the output nodes of the logic circuit 12. It will be understood that the integrated circuit 10 may include plural logic circuits 12, each having a respective set of scan cells 16 associated thereto (i.e., an associated scan register 14), and that plural scan registers may be coupled in series to form a single scan chain during test mode, or may be coupled so as to form a plurality of scan chains operable in parallel during scan mode, in a manner known in the art.

The logic circuit 12 may be configured to receive one or more test configuration signals (or test mode control signals) in order to control how the test is carried out (e.g., to control how the logic circuit 12 operates during test mode, in particular to control how the functional circuits 12A operate during test mode). For instance, such test mode control signals may include an "exit scan mode" signal that forces the electronic circuit 10 out of test mode when asserted, and/or a "RAM bypass" signal that bypasses one or more memories (RAMs) of the logic circuit 12 during the test when asserted, and/or a "clock domain activation" signal that activates one or more clock domains of the logic circuit 12 during the test when asserted. Also, the test mode control signals may be used to reconfigure the scan chains according to alternative test modes. In the known test architectures, the logic circuit 12 (in particular, the functional circuits 12A) may receive the test mode control signals via a dedicated test configuration interface (e.g., a JTAG interface) or via the functional I/O interface 17 of the integrated circuit 10. One or more embodiments as exemplified herein may instead allow accessing the functional circuits 12A via the scan test interface (i.e., using signals SI, SC and SE) during testing, thereby providing an improved and simplified test configuration interface.

Figure 2:
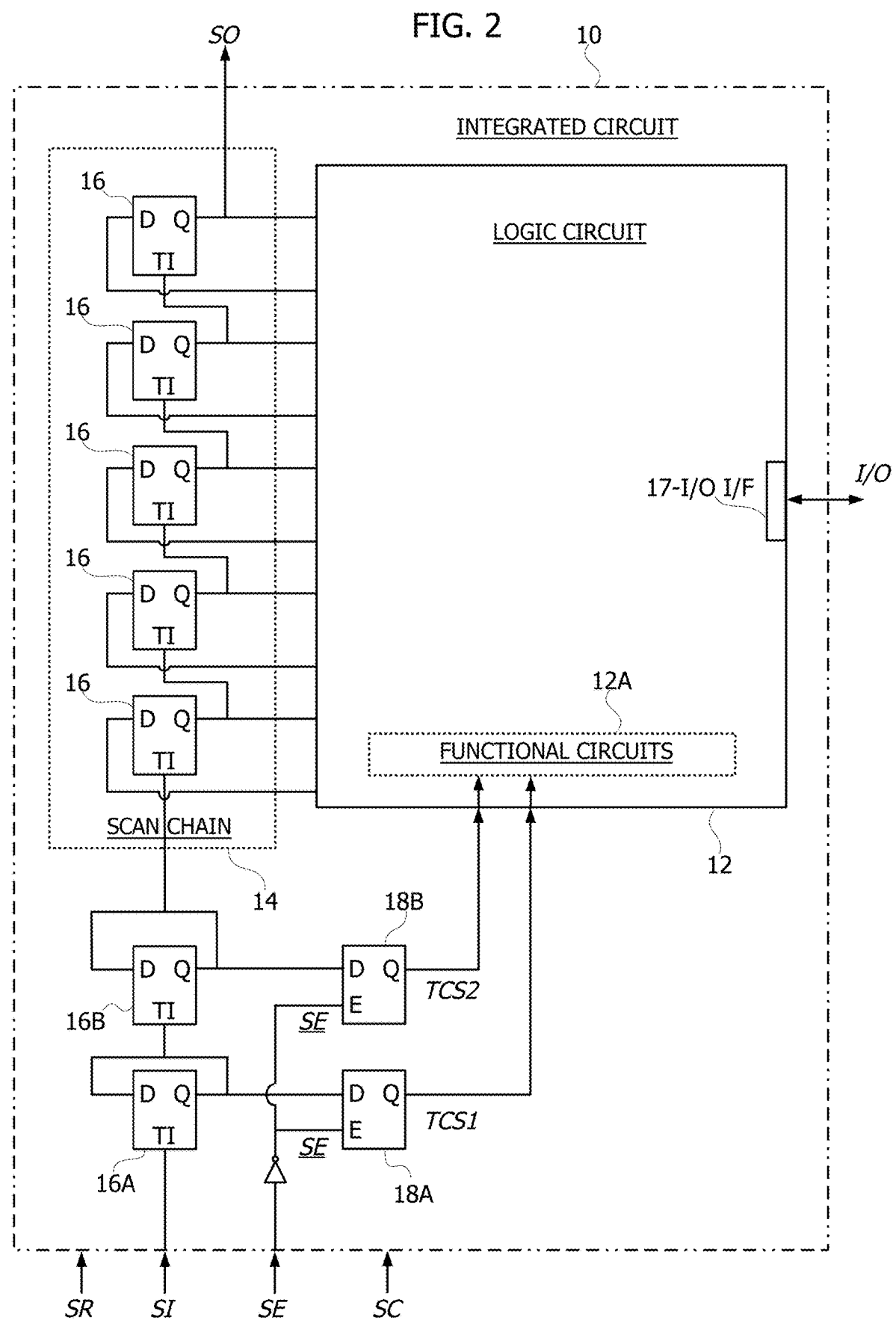
FIGS. 2 to 4 are circuit diagrams exemplary of an electronic device including digital logic and a scan chain configured for scan testing, according to various embodiments of the present description.

In particular, as exemplified in FIG. 2, an integrated circuit 10 according to one or more embodiments may include one or more (e.g., a set of) additional scan cells 16A, 16B (e.g., muxed-D scan cells) that are coupled in series to the scan chain 14 (i.e., in series to the scan cells 16 that are used to control and/or observe the input and output nodes of logic circuit 12), which will be referred to as "test control cells" or "control cells". By way of example, two control cells 16A, 16B are illustrated herein, but different embodiments may have another number of control cells (e.g., from one to some tens), depending on the number of test mode control signals that are to be received by the logic circuit 12. Each control cell 16A, 16B has the structure of a conventional scan cell 16, that is, it has a data input terminal D, a data output terminal Q, a test data input terminal TI, optionally a test data output terminal internally coupled to the data output terminal Q, and other control terminals depending on its type (e.g., a clock terminal CK and a scan enable terminal SE in the case of muxed-D cells, or a pair of clock terminals DCK and SCK in the case of clocked-scan cells). The control cells 16A, 16B receive the test signals in a manner known per se, just like the scan cells 16 of the scan chain 14

(e.g., the scan enable signal SE, the scan clock signal SC and the scan reset signal SR at their enable, clock and reset terminals, respectively).

The integrated circuit 10 further includes one or more (e.g., a set of) data retention cells/control latches 18A, 18B, with a respective control latch associated to each control cell 16A, 16B. In particular, each control latch 18A, 18B has a data input terminal D connected to the data output terminal Q of the corresponding control cell 16A, 16B, a data output terminal Q, and an enable terminal E. The control latches 18A, 18B are configured to receive the complement $\overline{SE}$ of the scan enable signal SE at their enable terminals E. Therefore, during the scan-in and scan-out test phases (when SE is asserted, e.g., set to '1' and thus $\overline{SE}$ is de-asserted, e.g., set to '0') the control latches 18A, 18B retain their stored value, while during the capture test phase (when SE is de-asserted, e.g., set to '0' and thus $\overline{SE}$ is asserted, e.g., set to '1') the control latches 18A, 18B are transparent and provide as output the values stored in the corresponding control cells 16A, 16B.

The control latches 18A, 18B are thus configured to operate collectively as a test mode control register and produce respective test mode control signals TCS1, TCS2 at their data output terminals Q as further discussed in the following. The test mode control signals are received by the functional circuits 12A of the logic circuit 12 to control their operation during the test phase, and/or to reconfigure the scan chains according to alternative test modes.

As exemplified in FIG. 2, the control cells 16A, 16B may be coupled in series to the scan chain 14 at the beginning thereof, that is, the test data input terminal TI of the first control cell 16A is connected to the scan-in pin to receive the scan-in signal SI, and the test data input terminal TI of any subsequent control cell 16B is connected to the data output terminal Q (or to the test data output terminal) of a preceding control cell. Furthermore, the data output terminal Q (or the test data output terminal) of the last control cell 16B is connected to the test data input terminal TI of the first scan cell 16 of the scan chain 14.

Alternatively, the control cells 16A, 16B may be coupled in series to the scan chain 14 at the end thereof, that is, the test data input terminal TI of the first control cell 16A is connected to the data output terminal Q (or to the test data output terminal) of the last scan cell 16 of the scan chain 14, and the test data input terminal TI of any subsequent control cell 16B is connected to the data output terminal Q (or to the test data output terminal) of a preceding control cell. Furthermore, the data output terminal Q (or the test data output terminal) of the last control cell 16B is connected to the scan-out pin to produce the scan-out signal SO.

In further embodiments, the control cells 16A, 16B may be coupled in series to the scan chain 14 both at the beginning and at the end thereof, or more generally at any position along the scan chain 14, also with the possibility of being interleaved with the scan cells 16.

As exemplified in FIG. 2, the data input terminal D of each control cell 16A, 16B may be connected to the data output terminal Q of the same control cell (e.g., the control cells may be connected in "feedback mode") to improve stability of the control signals TCS1, TCS2. Additionally or alternatively, the clock signal received by the control cells 16A, 16B may be gated by a logic gate as a function of the scan enable signal SE (e.g., the clock signal of the control cells may be enabled during the scan-in and scan-out test phases, when SE='1', and disabled during the capture test phase, when SE='0') to improve stability of the control signals TCS1, TCS2. For instance, such a gating function may be implemented by an AND logic gate that has a first input coupled to the scan enable terminal of circuit 10 to receive the scan enable signal SE and a second input coupled to the scan clock pin of circuit 10 to receive the scan clock signal SC, and produces the gated clock signal for the control cells 16A, 16B.

A test architecture as exemplified in FIG. 2 may thus operate as discussed in the following. Before starting the test, the test mode control signals TCS1, TCS2 are set to their default values (e.g., both de-asserted, '0') by initially storing default values into the control latches 18A, 18B. Then, the values stored in the control cells 16A, 16B may be set (written) whenever a new test vector is shifted into the scan chain 14 during the test of the electronic circuit 10, insofar as the control cells 16A, 16B are connected in series to the scan chain 14 and, from the point of view of test pattern generation, they are accessible just like any other scan cell 16 of the scan chain. Thus, the test vectors to be generated will include a number of bits equal to the number of scan cells 16 (i.e., the actual test vector) plus a number of bits equal to the number of control cells 16A, 16B (i.e., the values that will be used to configure the test, since the output of the control cells 16A, 16B is received at the functional circuits 12A via the test mode control register 18A, 18B). By enforcing certain Automatic Test Pattern Generation (ATPG) constraints during the test generation phase, it is possible to control the values that will be stored in the control cells 16A, 16B at each scan-in operation, thereby controlling the test mode configuration. For instance, in the case exemplified in FIG. 2 where the control cells 16A, 16B are coupled at the beginning of the scan chain 14, the test vector can be serially loaded into the scan chain 14 and the last (two) bits of the scan sequence are loaded into the control cells 16A, 16B. Alternatively, in the case where the control cells 16A, 16B are coupled at the end of the scan chain 14, the first (two) bits of the scan sequence are loaded into the control cells 16A, 16B and the test vector can be serially loaded into the scan chain 14 thereafter.

During the scan-in and scan-out phases, the control latches 18A, 18B are disabled (insofar as SE='1', thus SE='0') in order to prevent the test mode control signals TCS1, TCS2 from toggling in an uncontrolled manner, which could be detrimental to the test itself. For instance, if one of the test mode control signals TCS1, TCS2 is an "exit scan mode" signal, it should be prevented from toggling to an asserted state ('1') if not explicitly demanded by the test itself. When the test sequence (i.e., the "conventional" test vector plus the configuration bits) has been completely shifted in, the scan enable signal SE is de-asserted, the control latches 18A, 18B become transparent and thus the test vector and the test mode control signals are applied to the logic circuit 12 during a capture phase. The control cells 16A, 16B being connected in feedback mode ensures stability of the values of the test mode control signals TCS1, TCS2 during the capture phase. Additionally or alternatively, stability of the test mode control signals TCS1, TCS2 may be achieved without the "feedback mode" connection of the control cells 16A, 16B, by gating the clock signal received by the control cells 16A, 16B as discussed previously.

Therefore, an architecture as exemplified in FIG. 2 provides a scan testable electronic circuit 10 where the test can be configured without using a dedicated test configuration interface (e.g., JTAG) or a functional I/O interface, and without using a dedicated configuration protocol. Advantageously, the test could even be re-configured at each new shift-in operation of a test vector, albeit it might be preferable to modify the test configuration only when strictly necessary. Also, the architecture exemplified in FIG. 2 may result in a (slightly) increased test time, particularly if the number of control cells 16A, 16B is not negligible compared to the number of scan cells 16, insofar as each scan-in/scan-out operation takes a number of clock cycles that is equal to the sum of the number of scan cells 16 and control cells 16A, 16B.

Figure 3:
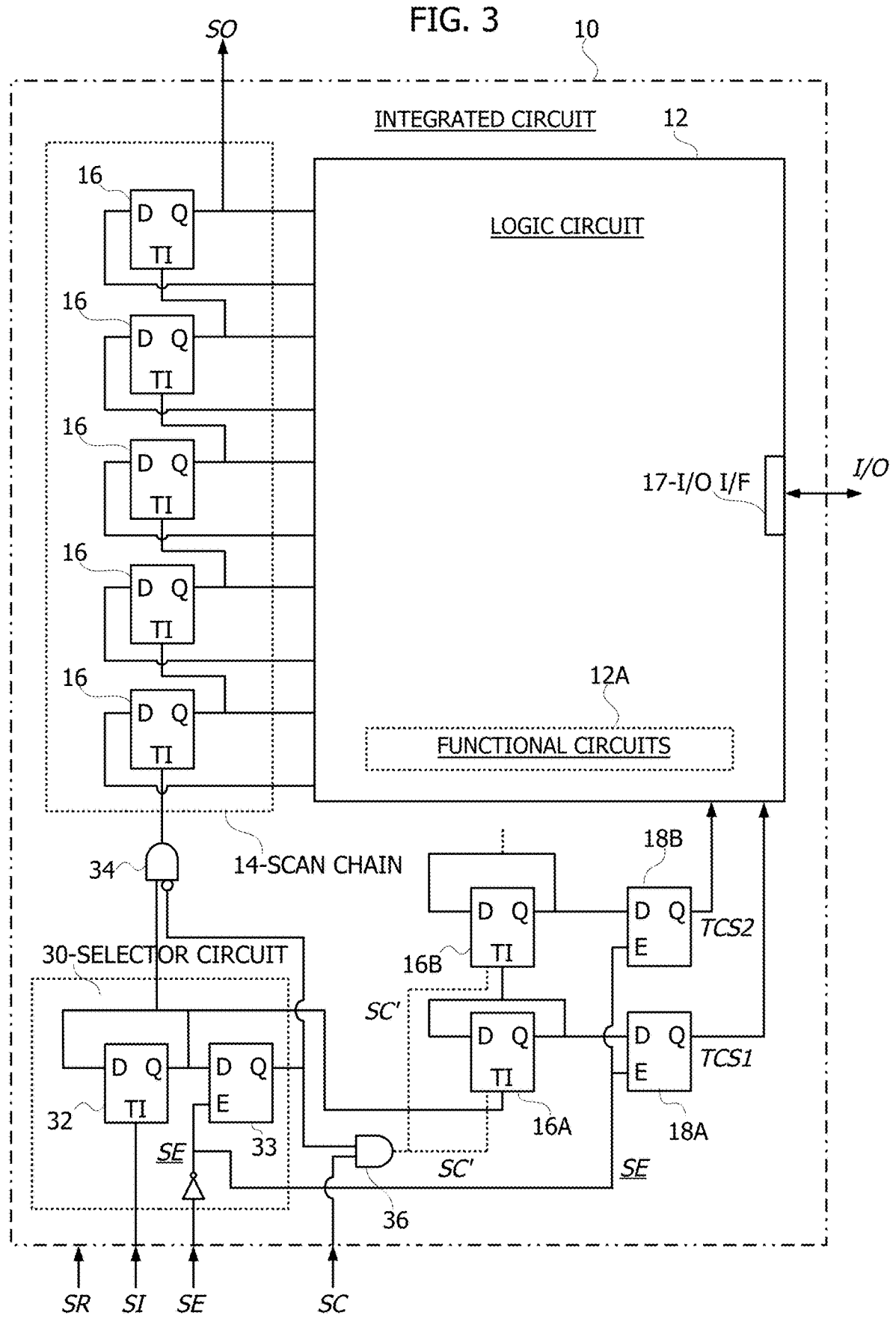

In order to improve (e.g., reduce) the test time while still taking advantage of the test configuration interface discussed above, one or more embodiments may relate to the architecture exemplified in FIG. 3. Here, differently from the architecture of FIG. 2, the control cells 16A, 16B are not coupled in series to the scan chain 14, and a scan path selector circuit 30 is provided. Substantially, the scan path selector circuit 30 allows selecting whether, during a scan-in/scan-out phase, the scan cells 16 or the control cells 16A, 16B will be loaded with the scan sequence input at the scan-in pin SI.

In particular, the selector circuit 30 includes a (single) selection cell 32 that is coupled in series to the scan chain 14 (e.g., via a logic gate 34 as further discussed in the following). The selection cell 32 has the structure of a conventional scan cell 16, that is, it has a data input terminal D, a data output terminal Q, a test data input terminal TI, optionally a test data output terminal internally coupled to the data output terminal Q, and further terminals depending on the type (e.g., a single clock terminal CK and a scan enable terminal SE in the case of a muxed-D scan cell, or a pair of clock terminals DCK, SCK in the case of a clocked-scan cell). The selection cell 32 receives the test signals in a manner known per se, just like the scan cells 16 of the scan chain 14 (e.g., it receives the scan enable signal SE, the scan clock signal SC and the scan reset signal SR at its enable, clock and reset terminals, respectively). The selection cell 32 may be coupled in series to the scan chain 14 at the beginning thereof, that is, its test data input terminal TI is connected to the scan-in pin to receive the scan-in signal SI, and its data output terminal Q (or its test data output terminal) is connectable, optionally via a gate 34 (as further discussed in the following), to the test data input terminal TI of the first scan cell 16 of the scan chain 14. Furthermore, the selector circuit 30 includes a selection data retention cell/selection latch 33 associated to the selection cell 32. In particular, the selection latch 33 has a data input terminal D connected to the data output terminal Q of the selection cell 32, a data output terminal Q, and an enable terminal E. The selection latch 33 is configured to receive the complement SE of the scan enable signal SE at its enable terminal E. Therefore, during the scan-in and scan-out test phases (when SE is asserted, e.g., set to '1' and thus SE is de-asserted, e.g., set to '0') the selection latch 33 retains its initial value, while during the capture test phase (when SE is de-asserted, e.g., set to '0' and thus SE is asserted, e.g., set to '1') the selection latch 33 is transparent.

Differently from the architecture of FIG. 2, the test data input terminal TI of the first control cell 16A may be connected to the data output terminal Q of the selection cell 32, and the data output terminal Q of the last control cell 16B may be disconnected from the test data input terminal TI of the first scan cell 16 of the scan chain 14. Also differently from the architecture of FIG. 2, the control cells 16A, 16B may receive a gated clock signal SC' at their scan clock terminals. In particular, the gated clock signal SC' is enabled (e.g., equal to the scan clock signal SC) if the output signal from selection latch 33 is asserted (e.g., set to '1'), while it is disabled (e.g., steadily low) if the output signal from selection latch 33 is de-asserted (e.g., set to '0'). For instance, the gated clock signal SC' may be produced at the output of an AND logic gate 36 that has a first input coupled to the data output terminal of selection latch 33 and a second input coupled to the scan clock pin of circuit 10 to receive the scan clock signal SC. Also differently from the architecture of FIG. 2, and optionally, the test data input terminal TI of the first scan cell 16 of the scan chain 14 receives the output signal from the data output terminal Q of the selection cell 32 if the output signal from selection latch 33 is de-asserted (e.g., set to '0'), while it is disabled (e.g., steadily low) if the output signal from selection latch 33 is asserted (e.g., set to '1'). For instance, the test data input terminal TI of the first scan cell 16 may be coupled to the output of an AND logic gate 34 that has a first input coupled to the data output terminal Q of selection cell 32 and a second input coupled to the complemented data output terminal of selection latch 33. In some embodiments that do not include gate 34, the test data input terminal TI of the first scan cell 16 of the scan chain 14 may be directly coupled to the data output terminal Q of the selection cell 32.

Similarly to the architecture of FIG. 2, the data input terminal D of each control cell 16A, 16B may be connected to the data output terminal Q of the same control cell (e.g., the control cells may be connected in "feedback mode"). However, more generally, as long as the test mode control signals TCS1, TCS2 are not corrupted during shift the "feedback mode" connection of the control cells 16A, 16B may be unnecessary, insofar as the clock signal of the control cells 16A, 16B is gated by the output of the selection latch 33.

The relative positioning of the scan path selector 30 and the control cells 16A, 16B may be different in different embodiments. For instance, the selection cell 32 may be arranged downstream of the control cells 16A, 16B (with the control cells 16A, 16B connected to the scan-in pin as illustrated in FIG. 2). Alternatively, the selection cell 32 may be arranged interleaved with the control cells 16A, 16B (e.g., between 16A and 16B).

A test architecture as exemplified in FIG. 3 may thus operate as discussed in the following. Before starting the test, the test mode control signals TCS1, TCS2 are set to their default values (e.g., both de-asserted, '0') by initially storing default values into the control latches 18A, 18B. Similarly, the selection latch 33 of the selector circuit 30 is loaded with a default value (e.g., '0'), so that its output signal is de-asserted. As long as the output of latch 33 remains de-asserted, the control cells 16A, 16B are disabled (their clock signal is gated by gate 36) and the test configuration is maintained by the control latches 18A, 18B. Also as long as the output of latch 33 remains de-asserted, the scan chain 14 is coupled in series to the selection cell 32 (gate 34 is transparent to the signal output by cell 32). Therefore, the "conventional" scan chain 14 can be accessed as in conventional devices, shifting in and out one or more test vectors sequentially, without affecting the values stored in the control cells 16A, 16B and thus the values of the test mode control signals TCS1, TCS2. Therefore, plural test vectors may be applied while maintaining the same test configuration, at the cost of one additional clock cycle per test vector if compared to conventional solutions, insofar as each scan sequence has to include (e.g., be terminated with) a '0' value to be loaded in the selection cell 32 in order to maintain unaffected the control cells 16A, 16B during the capture phase.

When a new test configuration is to be loaded, a '1' value is loaded in the selection cell 32 via the scan-in signal SI while the scan enable signal SE is asserted (e.g., set to '1'). Subsequently, signal SE is de-asserted (e.g., set to '0'), selection latch 33 becomes transparent and provides an asserted output signal. Therefore, the control cells 16A, 16B are now active insofar as SC'=SC, and the scan chain 14 is optionally decoupled from the selection cell 32 insofar as the output of gate 34 remains steadily de-asserted. Subsequently, signal SE is asserted again (e.g., set again to '1'), selection latch 33 stores the asserted output signal, and a scan sequence can be loaded into the control cells 16A, 16B via the selection cell 32. A configuration sequence is shifted in, which has a number of bits equal to the number of control cells 16A, 16B plus one, insofar as each configuration sequence has to include (e.g., be terminated with) a '0' value to be loaded in the selection cell 32. Subsequently, signal SE is de-asserted again (e.g., set again to '0'), selection latch 33 becomes transparent and provides a de-asserted output signal. Subsequently, signal SE is asserted again (e.g., set again to '1'), selection latch 33 stores the de-asserted output signal, and a scan sequence can be loaded into the scan cells 16 via the selection cell 32. At this point, the "conventional" scan chain 14 can be accessed again as in conventional devices, shifting in and out one or more test vectors sequentially, with a different configuration stored in the test mode control register (e.g., latches 18A, 18B). Plural test vectors may be fed to the integrated circuit 10 maintaining the updated test configuration.

Therefore, an architecture as exemplified in FIG. 3 provides a scan testable electronic circuit 10 where the test can be configured without using a dedicated test configuration interface (e.g., JTAG) or a functional I/O interface, and without using a dedicated configuration protocol. Advantageously with respect to the architecture exemplified in FIG. 2, each scan-in/scan-out operation takes a number of clock cycles that is equal to the number of scan cells 16 plus one, as long as the test configuration is the same.

As anticipated, a desirable feature during testing of electronic circuits is that of being able to read output data from the logic circuit 12 without resorting to a dedicated or functional I/O interface. In this regard, one or more embodiments may relate to the architecture exemplified in FIG. 4, which provides such a functionality.

The architecture of FIG. 4 differs from the architecture of FIG. 3 in that the control cells 16A, 16B are not arranged in a feedback configuration, but have their data input terminals D configured to receive respective signals from the logic circuit 12 (e.g., from one or more of the functional circuits 12A), whose values can be captured during testing and output by the circuit 10 via the scan-out signal SO as further discussed in the following. It is noted that the control cells 16A, 16B receive the gated clock signal SC' as in the architecture of FIG. 3, and the corresponding clock connections are not explicitly illustrated in FIG. 4 for ease of illustration. Furthermore, compared to the architecture of FIG. 3, the architecture of FIG. 4 includes a multiplexer 42 configured to pass to the scan-out pin either the output signal from the scan chain 14 (e.g., from the last scan cell 16) if the output signal from selection latch 33 is de-asserted, or the output signal from the last control cell 16B if the output signal from selection latch 33 is asserted.

Furthermore, compared to the architecture of FIG. 3, the data retention cells/control latches 18A, 18B are substituted with data retention cells/control flip-flops 19A, 19B. In particular, each control flip-flop 19A, 19B has a data input terminal D connected to the data output terminal Q of the corresponding control cell 16A, 16B, a data output terminal Q configured to produce a respective test mode control signal TCS1, TCS2, a clock terminal, and an enable terminal. The control flip-flops 19A, 19B receive the gated clock signal SC' at their clock terminals and a gated enable signal SE' at their enable terminals. In particular, the gated enable signal SE' is equal to the complement of the scan enable signal SE if the output signal from selection latch 33 is asserted (e.g., set to '1'), while it is steadily de-asserted (e.g., set to '0') if the output signal from selection latch 33 is de-asserted (e.g., set to '0'). For instance, the gated enable signal SE' may be produced at the output of an AND logic gate 44 that has a first input coupled to the data output terminal of selection latch 33 and a second complemented input coupled to the scan enable pin of circuit 10 to receive and complement the scan enable signal SE.

In alternative to having an enable terminal, the control flip-flops 19A, 19B may receive a further gated clock signal at their clock terminals. In particular, the further gated clock signal is enabled (e.g., equal to the scan clock signal SC) if the gated enable signal SE' is asserted (e.g., set to '1'), while it is disabled (e.g., steadily low) if the gated enable signal SE' is de-asserted (e.g., set to '0'). For instance, the further gated clock signal may be produced at the output of an AND logic gate that has a first input configured to receive the gated enable signal SE' and a second input coupled to the scan clock pin of circuit 10 to receive the scan clock signal SC.

A test architecture as exemplified in FIG. 4 may thus operate as discussed in the following. Bit loading in the control cells 16A, 16B and feeding of test vectors to the scan chain 14 is carried out substantially as discussed with reference to the architecture of FIG. 3, with the difference that the control flip-flops 19A, 19B are configured to retain the test configuration data as long as the gated enable signal SE' remains de-asserted, even if the control cells 16A, 16B are overwritten in the meantime with new values that are to be output. When data has to be read from the control cells 16A, 16B, a '1' value is loaded in the selection cell 32 via the scan-in signal SI while the scan enable signal SE is asserted (e.g., set to '1'). Subsequently, signal SE is de-asserted (e.g., set to '0'), selection latch 33 becomes transparent and provides an asserted output signal. Therefore, the control cells 16A, 16B are now active insofar as SC'=SC, and the scan chain 14 is optionally decoupled from the selection cell 32 insofar as the output of gate 34 remains steadily de-asserted. Subsequently, signal SE is asserted again (e.g., set again to '1'), selection latch 33 stores the asserted output signal, and an output sequence can be shifted out of the control cells 16A, 16B via the multiplexer 42, while at the same time it is possible to shift-in the bit values that are desired to be loaded in the control flip-flops 19A, 19B. The output sequence has a number of bits equal to the number of control cells 16A, 16B plus one, insofar as each output sequence has to include (e.g., be terminated with) a '0' value to be loaded in the selection cell 32.

Figure 4:
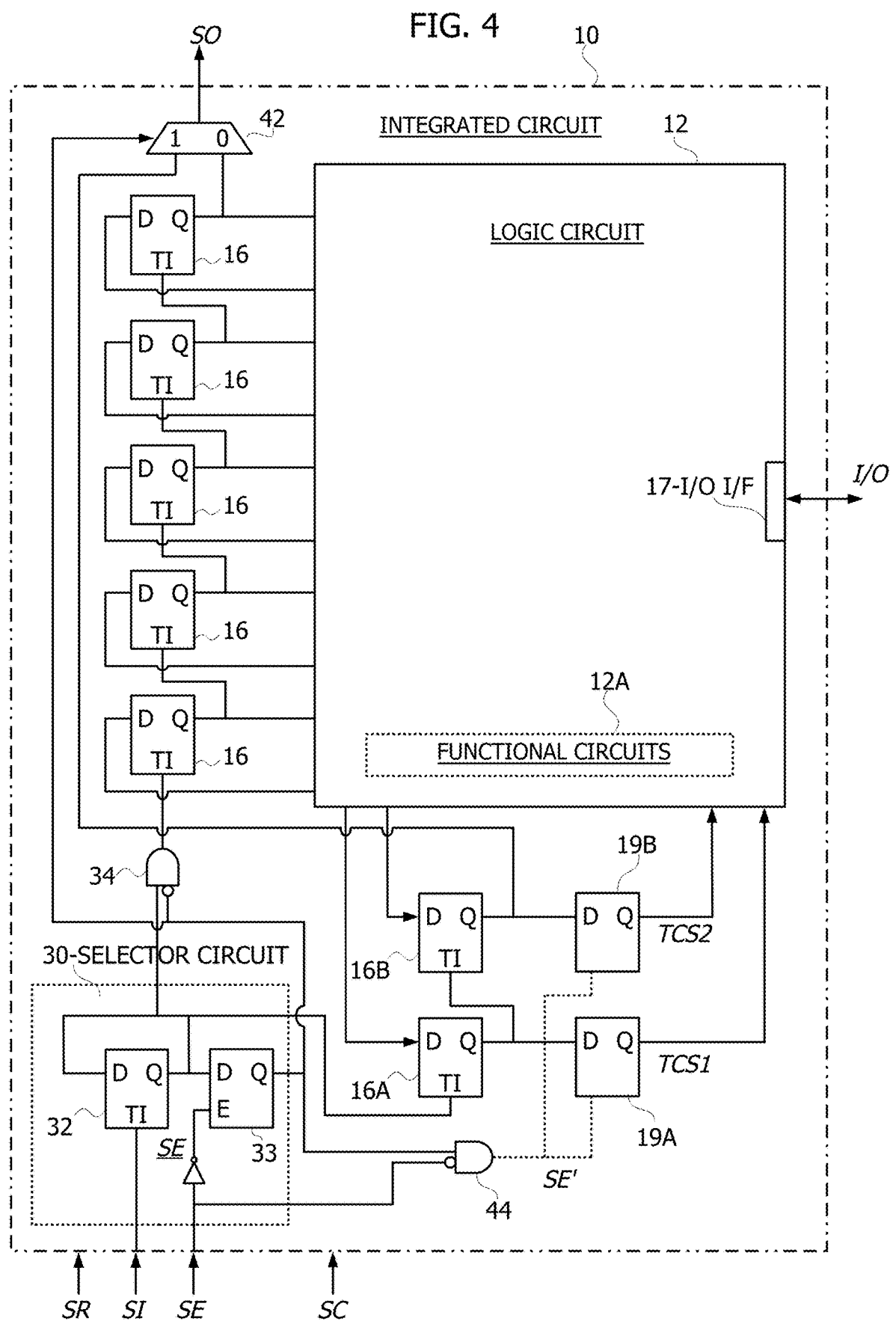

Therefore, one or more embodiments as exemplified in FIG. 4 provide a scan testable electronic circuit 10 where output data can be read from the logic circuit 12 without using a functional I/O interface, and with a number of clock cycles equal to the number of the control cells 16A, 16B plus one.

Additionally or alternatively, output of data from the logic circuit 12 during testing may be carried out resorting to reading cells (not illustrated herein for ease of illustration) that are distinct from the control cells 16A, 16B. For instance, starting from the architecture of FIG. 2, one or more data reading cells may be coupled in series to the scan chain 14 (e.g., before or after the control cells 16A, 16B, as well as before or after the scan register 14). Such data reading cells have their data input terminals D configured to receive respective signals from the logic circuit 12, whose values can be captured during testing and output by the circuit 10 via the scan-out signal SO. In this case, each shift-in or shift-out operation will require a number of clock cycles equal to the number of scan cells 16 plus the number of control cells 16A, 16B plus the number of data reading cells. Alternatively, starting from the architecture of FIG. 3, one or more data reading cells may be coupled in series amongst themselves, have their data input terminals D configured to receive respective signals from the logic circuit 12, and be coupled to the multiplexer 42 to provide their data as output only on request.

One or more embodiments as exemplified herein may thus provide one or more of the following advantages:

a test methodology that can be easily integrated with existing scan chain insertion flows (also with scan compression and any other scan test modes);

a simple test interface;

lower development costs;

higher test coverage on logic; and use of the same protocol as scan for configuring the scan test, resulting in cheaper and faster testing.

Without prejudice to the underlying principles, the details and embodiments may vary, even significantly, with respect to what has been described by way of example, without departing from the extent of protection.

The extent of protection is determined by the annexed claims.

The invention claimed is:

1. A scan-testable integrated circuit, comprising:

a logic circuit configured to receive one or more test mode control signals;

a signal interface configured to receive a scan-in signal, a scan enable signal, and a scan clock signal, and configured to produce a scan-out signal;

a scan register comprising a plurality of scan cells coupled to the signal interface to receive the scan enable signal and the scan clock signal, wherein the scan cells are selectively couplable to the logic circuit in response to the scan enable signal being de-asserted, or serially one to another so as to form a scan chain arranged to receive the scan-in signal and produce the scan-out signal in response to the scan enable signal being asserted;

one or more additional scan cells coupled to the signal interface serially one to another and configured to receive and propagate the scan-in signal in response to the scan enable signal being asserted; and one or more data retention cells coupled to respective ones of the one or more additional scan cells and to the logic circuit, wherein the one or more data retention cells are configured to provide as output one or more values stored in the respective ones of the one or more additional scan cells to produce the one or more test mode control signals in response to the scan enable signal being de-asserted, and configured to prevent the one or more test mode control signals from changing in response to the scan enable signal being asserted.

2. The scan-testable integrated circuit of claim 1, wherein the one or more additional scan cells have their data output terminals connected in feedback mode to their respective data input terminals.

3. The scan-testable integrated circuit of claim 1, wherein the one or more additional scan cells are configured to receive a gated scan clock signal, wherein the gated scan clock signal is configured to be enabled in response to the scan enable signal being asserted, and configured to be disabled in response to the scan enable signal being de-asserted.

4. The scan-testable integrated circuit of claim 1, wherein the logic circuit comprises one or more functional circuits configured to receive the one or more test mode control signals for configuring their operation mode.

5. The scan-testable integrated circuit of claim 4, wherein:
the one or more functional circuits comprise at least one of a phase-locked loop circuit, a memory, or an analog circuit; and
the one or more test mode control signals comprise at least one of a first signal for exiting test mode of the integrated circuit, a second signal for bypassing a logic memory of the logic circuit, or a third signal for activating a clock domain of the logic circuit.

6. The scan-testable integrated circuit of claim 1, wherein the signal interface comprises:
a scan test interface comprising a scan-in pin configured to receive the scan-in signal, a scan enable pin config-ured to receive the scan enable signal, a scan clock pin configured to receive the scan clock signal, and a scan-out pin configured to produce the scan-out signal; and/or
a functional interface couplable to the plurality of scan cells and to the one or more additional scan cells upon reconfiguration.

7. The scan-testable integrated circuit of claim 1, wherein the one or more additional scan cells are selectively cou-plable in series to the scan chain in response to the scan enable signal being asserted.

8. The scan-testable integrated circuit of claim 7, wherein the one or more additional scan cells are arranged serially to pass:
the scan-in signal from the signal interface to a first one of the scan cells of the scan chain; and/or
the scan-out signal from a last one of the scan cells of the scan chain to the signal interface.

9. The scan-testable integrated circuit of claim 1, further comprising:
a selection scan cell coupled to the signal interface and configured to receive the scan-in signal in response to the scan enable signal being asserted; and
a selection data retention cell coupled to the selection scan cell, wherein the selection data retention cell is con-figured to provide as output a selection value stored in the selection scan cell to produce a selection signal in response to the scan enable signal being de-asserted, and configured to prevent the selection signal from changing in response to the scan enable signal being asserted;
wherein the one or more additional scan cells are coupled to an output of the selection scan cell serially one to another and configured to receive the scan-in signal in response to the selection signal being asserted.

10. The scan-testable integrated circuit of claim 9, wherein the selection scan cell has a test input terminal coupled to the signal interface and configured to receive the scan-in signal, and a data output terminal coupled to an input of the scan register and to a first test input terminal of a first one of the one or more additional scan cells.

11. The scan-testable integrated circuit of claim 1, further comprising one or more data reading scan cells coupled to the logic circuit to be written thereby, and couplable to the signal interface serially one to another and configured to produce the scan-out signal in response to the scan enable signal being asserted.

12. The scan-testable integrated circuit of claim 1, wherein the one or more additional scan cells are coupled to the logic circuit to be written thereby, and couplable to the signal interface serially one to another and configured to produce the scan-out signal in response to the scan enable signal being asserted.

13. The scan-testable integrated circuit of claim 12, wherein the one or more data retention cells are configured to provide as output the one or more values previously stored in the respective ones of the one or more additional scan cells to produce the one or more test mode control signals in response to the scan enable signal being de-asserted.

14. A method of scan-testing an integrated circuit, the method comprising:
providing a scan-in signal, a scan enable signal and a scan clock signal to a signal interface;
receiving, at a plurality of scan cells of a scan register coupled to the signal interface, the scan enable signal and the scan clock signal; and
sequentially performing the following steps:
i) asserting the scan enable signal to selectively couple the scan cells serially one to another so as to form a scan chain arranged to receive the scan-in signal, configure one or more additional scan cells to receive and propagate the scan-in signal, and configure one or more data retention cells, coupled to respective ones of the one or more additional scan cells, to prevent one or more test mode control signals, pro-duced by the one or more data retention cells, from changing;
ii) shifting-in a test sequence via the scan-in signal to load the scan cells and the one or more additional scan cells with a test vector and a test configuration vector, respectively;
iii) de-asserting the scan enable signal to selectively couple the scan cells to a logic circuit and produce the one or more test mode control signals for the logic circuit by outputting from the one or more data retention cells one or more values stored in the respective ones of the one or more additional scan cells;
iv) producing one or more clock pulses in the scan clock signal to carry out a test capture step;
v) asserting the scan enable signal; and
vi) shifting-out an output sequence from the scan cells via a scan-out signal produced by the signal inter-face.

15. The method of claim 14, further comprising receiving, by the one or more additional scan cells, a gated scan clock signal that is enabled in response to the scan enable signal being asserted, and disabled in response to the scan enable signal being de-asserted.

16. The method of claim 14, further comprising config-uring, by the one or more test mode control signals, respec-tive operation modes of one or more functional circuits in the logic circuit.

17. The method of claim 16, wherein the one or more test mode control signals comprise at least one of a first signal for exiting test mode of the integrated circuit, a second signal for bypassing a logic memory of the logic circuit, or a third signal for activating a clock domain of the logic circuit.

18. The method of claim 14, further comprising selec-tively coupling in series the one or more additional scan cells to the scan chain in response to the scan enable signal being asserted.

19. The method of claim 18, further comprising serially passing, by the one or more additional scan cells:

the scan-in signal from the signal interface to a first one of the scan cells of the scan chain; and/or the scan-out signal from a last one of the scan cells of the scan chain to the signal interface.

20. The method of claim 14, further comprising:

receiving, by a selection scan cell coupled to the signal interface, the scan-in signal in response to the scan enable signal being asserted;

providing, by a selection data retention cell coupled to the selection scan cell, a selection value stored in the selection scan cell to produce a selection signal in response to the scan enable signal being de-asserted;

preventing, by the selection data retention cell, the selection signal from changing in response to the scan enable signal being asserted; and receiving, by the one or more additional scan cells, the scan-in signal in response to the selection signal being asserted, the one or more additional scan cells being coupled to an output of the selection scan cell serially one to another.

\* \* \* \* \*